US005493131A

United States Patent [19]
Miyata et al.

[11] Patent Number: 5,493,131
[45] Date of Patent: *Feb. 20, 1996

[54] DIAMOND RECTIFYING ELEMENT

[75] Inventors: Koichi Miyata; Kimitsugu Saito, both of Kobe, Japan; David L. Dreifus, Cary, N.C.

[73] Assignee: Kobe Steel USA, Inc., Research Triangle Park, N.C.

[*] Notice: The term of this patent shall not extend beyond the expiration date of Pat. No. 5,371,383.

[21] Appl. No.: 314,548

[22] Filed: Sep. 28, 1994

Related U.S. Application Data

[63] Continuation of Ser. No. 61,856, May 14, 1993, abandoned.

[51] Int. Cl.$^6$ ................................................. H01L 29/04
[52] U.S. Cl. ................................ 257/77; 257/64; 257/73
[58] Field of Search ..................... 257/77, 627, 64, 257/73

[56] References Cited

U.S. PATENT DOCUMENTS

| | | | |
|---|---|---|---|
| 4,670,968 | 6/1987 | Mikami et al. | 257/272 |
| 4,806,900 | 2/1989 | Fujimori et al. | 338/22 R |
| 5,066,938 | 11/1991 | Kobashi et al. | 338/22 SD |
| 5,086,014 | 2/1992 | Miyata et al. | 257/77 |
| 5,089,802 | 2/1992 | Yamazaki | 338/22 SD |
| 5,107,315 | 4/1992 | Kumagai et al. | 257/77 |
| 5,124,179 | 6/1992 | Garg et al. | 427/249 |
| 5,126,206 | 6/1992 | Garg et al. | 428/408 |
| 5,183,530 | 2/1993 | Yamazaki | 156/643 |
| 5,298,765 | 3/1994 | Nishimura | 257/77 |
| 5,298,766 | 3/1994 | Kobashi et al. | 257/77 |
| 5,341,063 | 8/1994 | Kumar | 257/627 |
| 5,371,383 | 12/1994 | Miyata et al. | 257/77 |
| 5,391,895 | 2/1995 | Draifus | 257/77 |
| 5,420,443 | 5/1995 | Dreifus et al. | 257/77 |
| 5,424,561 | 6/1995 | Tachibana et al. | 257/77 |

FOREIGN PATENT DOCUMENTS

| | | |
|---|---|---|
| 421397A1 | 4/1991 | European Pat. Off. . |
| 0445998 | 9/1991 | European Pat. Off. ............ 257/77 |
| 59-27754 | 2/1984 | Japan . |
| 59-137396 | 8/1984 | Japan . |
| 60-12747 | 1/1985 | Japan . |
| 61-3320 | 1/1986 | Japan . |
| 61-251158 | 11/1986 | Japan . |
| 64-55862 | 3/1989 | Japan . |
| 64-68966 | 3/1989 | Japan . |
| 1-158774 | 6/1989 | Japan . |
| 1-244399 | 9/1989 | Japan . |
| 2-273960 | 11/1990 | Japan . |
| 3-12966 | 1/1991 | Japan . |
| 3-94429 | 4/1991 | Japan . |
| 3-110866 | 5/1991 | Japan . |
| 3-120865 | 5/1991 | Japan . |
| 3-160731 | 7/1991 | Japan . |
| 3-263872 | 11/1991 | Japan . |
| 3-278463 | 12/1991 | Japan . |
| 3-278474 | 12/1991 | Japan . |
| 4-26161 | 1/1992 | Japan . |
| 4-26172 | 1/1992 | Japan . |
| 2243949A | 11/1991 | United Kingdom . |
| 2252202 | 7/1992 | United Kingdom ............ 257/77 |

OTHER PUBLICATIONS

Geis, "Growth of textured diamond films on foreign substrates from attached seed crystals," *Applied Physics Letters* 55(6), Aug. 1989, pp. 550–552.

*Primary Examiner*—Sara W. Crane
*Assistant Examiner*—Courtney A. Bowers
*Attorney, Agent, or Firm*—Bell, Seltzer, Park & Gibson

[57] ABSTRACT

The rectifying element is comprised of two electrodes, an undoped diamond film, and a B-doped p-type diamond film. The diamond films are formed of highly-oriented diamond films, of which at least 80% of the surface area consists of (100) or (111) crystal planes, and the differences $\{\Delta\alpha, \Delta\beta, \Delta\gamma\}$ of Euler angles $\{\alpha, \beta, \gamma\}$, which represent the orientations of crystal planes, simultaneously satisfy $|\Delta\alpha|\leq 5°$, $|\Delta\beta|\leq 5°$ and $|\Delta\gamma|\leq 5°$ between adjacent crystal planes. The diamond rectifying element thus constructed have an excellent electrical characteristics, and multiple of the elements can be produced on a large area at low cost. The diamond rectifying elements can be used for heat-resistant and high-power rectifying elements.

26 Claims, 6 Drawing Sheets

FIG. IA

STANDARD ORIENTATION OF
CRYSTAL PLANE

FIG. IB

SURFACE STRUCTURE OF DIAMOND FILM
WITH HIGHLY ORIENTED (100) CRYSTAL PLANE

DIAMOND RECTIFYING ELEMENT

This is a continuation of application Ser. No. 08/061,856 filed on 14 May 1993 now abandoned.

BACKGROUND OF THE INVENTION

1. Field of the Invention

The present invention relates to a diamond rectifying element comprising a pair of electrodes provided on the surface of semiconducting diamond film or provided so as to sandwich said semiconducting diamond film, more particularly to a diamond rectifying element suitable for use under high temperature.

2. Prior Art

Diamond has a large band gap (5.5 eV) as well as a high thermal conductivity (20 W.K/cm) and high carrier mobilities (2000 $cm^2$/V.sec. for electron and 2100 $cm^2$/V.sec. for hole) and a high dielectric breakdown voltage ($10^7$V/cm). Since it is possible to make a diamond semiconductor by incorporating appropriate impurity atoms in the diamond film, the film has drawn a considerable attention for application to various fields such as electronic devices working under high temperature and radiation, and high power and high frequency devices.

In addition, there are many proposals for various structures and manufacturing processes for rectifying elements using diamond films (Japanese under Provisional Publications hei 3-120865, 3-278474, 4-26161, 3-278463, 1-244399, and FP 1589, and U.S. Pat. No. 5,086,014).

Diamond rectifying elements according to these prior art all comprises a single crystal diamond substrate, a homoepitaxial diamond film, or a polycrystalline diamond film. Single crystal diamond has a disadvantage for practical use of rectifying element due to its small surface area (several square mm). Moreover, single crystal diamond is very expensive so that the manufacturing cost will also be high. Further, many crystal defects are contained in natural and synthetic single crystal diamonds, therefore the electrical characteristics of the rectifying elements have not reached to the level of theoretical characteristics for single crystal diamond.

Recent advancement of diamond film deposition technology has made possible to grow uniform polycrystalline diamond film on a large non-diamond substrate. Production of rectifying elements using polycrystalline diamond films has an advantage that many rectifying elements can be fabricated simultaneously and hence the manufacturing cost can be reduced. However, currently produced polycrystalline diamond films contain many grain boundaries and crystal defects, and the film surface is very rough. The grain boundaries cause carrier scatterings, which results in a significant reduction of the carrier mobilities as well as unwanted current leakages. If the element is used at high temperature in air, the diamond film is gradually oxidized and graphitized along grain boundaries. Therefore, the maximum operation temperature of the rectifying element is restricted compared with homoepitaxial film elements. Crystal defects also are responsible to current leakages in the reversed bias state. The roughness of the film surface causes a nonuniform electric field, leading to dielectric breakdown at low voltage.

Thus, although polycrystalline diamond films have an advantage for the mass production of rectifying elements the characteristics of the rectifying elements are still far from the commercially acceptable level.

SUMMARY OF THE INVENTION

It is an object of the present invention to provide a diamond rectifying element having an excellent electrical characteristics, which can be mass produced at low cost.

A diamond rectifying element according to the present invention comprises a semiconducting layer of a highly-oriented diamond film grown by chemical vapor deposition and a pair of electrodes provided on the surface of said semiconducting layer or provided so as to sandwich said semiconducting layer. At least 80% of the surface area of said highly-oriented diamond film consists of either (100) or (111) crystal planes of diamond. The differences $\{\Delta\alpha, \Delta\beta, \Delta\gamma\}$ of Euler angles $\{\alpha, \beta, \gamma\}$, which represent the orientations of the crystal planes, simultaneously satisfy $|\Delta\alpha|\leq 5°$, $|\Delta\beta|\leq 5°$, $|\Delta\gamma|\leq 5°$ between adjacent crystal planes.

Figure 1A:
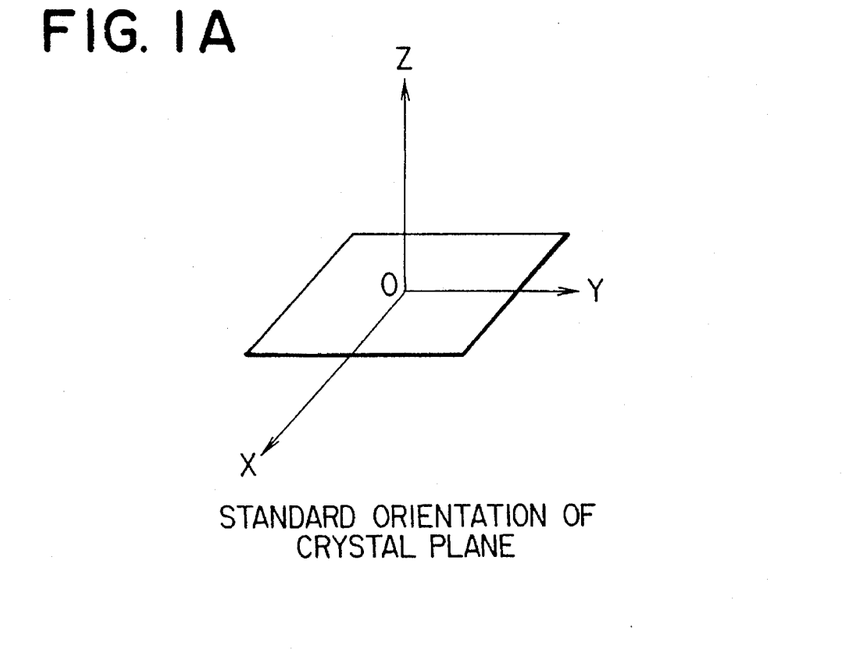
Figure 1B:
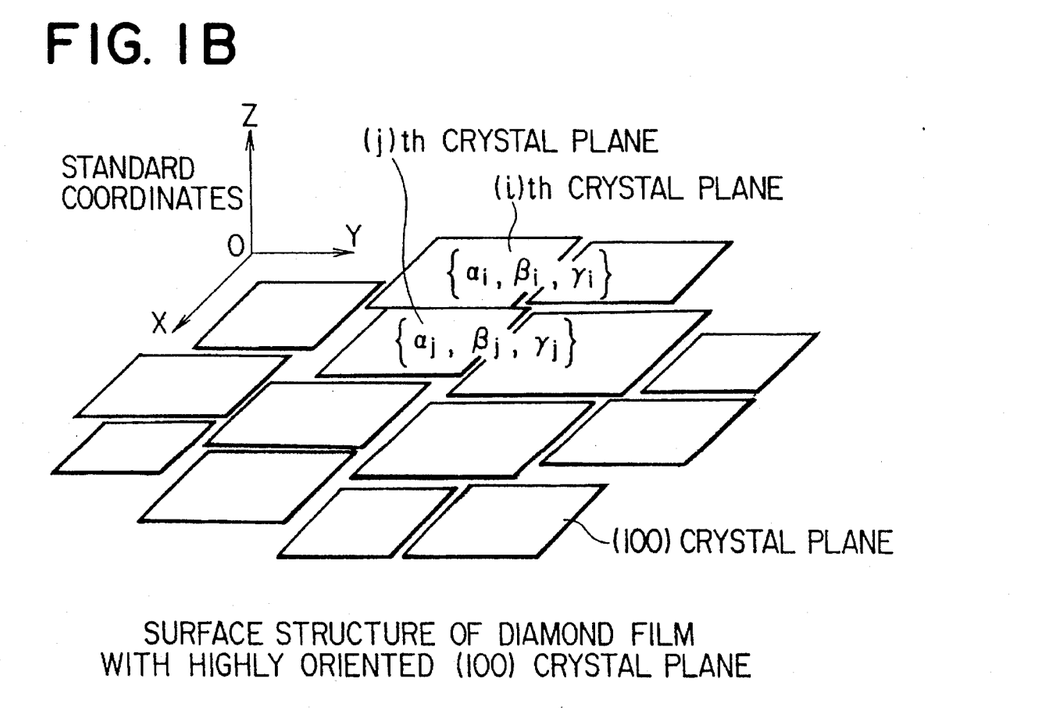

FIGS. 1A and 1B show diagrammatically the surface structure of a diamond film of the invention wherein the (100) crystal planes are highly-oriented according to the invention. FIG. 1A defines the x-axis and the y-axis which cross at right angles to each other in the film surface, and the z-axis along the film surface normal. As shown in FIG. 1B, the Euler angles, indicating the orientations of crystal planes of the (i)th diamond crystal and the adjacent (j)th diamond crystal, are denoted as $\{\alpha_1, \beta_i, \gamma_i\}$ respectively, and the angle differences between them are denoted as $\{\Delta\alpha, \Delta\beta, \Delta\gamma\}$.

The Euler angles $\{\alpha, \beta, \gamma\}$ indicate the orientation of the crystal plane that can be attained by rotating the standard crystal plane around the standard coordinate axes z, y and z, by the angles $\alpha$, $\beta$ and $\gamma$ one after another.

According to this invention, the highly-oriented diamond film must satisfy $|\Delta\alpha|\leq 5°$, $|\Delta\beta|\leq 5°$ and $|\Delta\gamma|\leq 5°$ simultaneously. It therefore follows that the crystals are oriented to a high degree and that the carrier mobilities are as high as those of with a homoepitaxial diamond film.

For the case of crystals with the (111) crystal plane, the crystals are highly oriented as well and the hole mobility becomes high when all the absolute values of the differences in Euler angles are below 5°. Such a highly-oriented diamond film can be formed, for instance, by subjecting a mirror-finished silicon substrate to a microwave radiation while applying a negative bias in the gas phase containing methane.

Also, since the misorientation between crystal planes is within ±5° in the highly-oriented diamond film used in the present invention, adjacent (100) planes are unified after a prolonged growth period, therefore the effect of grain boundaries will be insignificant. Since the diamond film is deposited by chemical vapor deposition, the diamond film according to the present invention contains less impurities and defects compared to natural and synthetic diamonds. For these reasons, the hole mobility of the highly-oriented diamond film according to the present invention is higher than the reported values for polycrystalline diamond films and single crystal diamonds. Moreover, said highly-oriented diamond film can significantly reduce current leakages which occur along grain boundaries. Further, oxidation and graphitization do not occur in the highly-oriented diamond film even in air at high temperature. Therefore, a stable and prolonged operation of the diamond rectifying element according to the present invention can be achieved at high temperature.

Since the highly-oriented diamond film of the present invention has a smoother surface, the electric field is uniform. Therefore, uniform characteristics between elements can be achieved and reproducible elements can be obtained.

Since inexpensive commercial silicon substrates can be used as the substrates for CVD and since the highly-oriented diamond film can be grown on large area, mass production and cost reduction of diamond rectifying elements can be achieved.

A high-resistant diamond layer, whose thickness is between 10 Å and 1 mm and whose specific resistance is at least $10^2$ Ω.cm or higher, is selectively formed between the electrode and the semiconducting layer of highly-oriented diamond film. This high-resistant diamond layer is a barrier to prevent the current flow in the reversed direction. In case that the thickness of the high-resistant diamond layer is less than 10 Å, it has no effect as a barrier because the tunneling current flows. On the other hand, if the thickness of the high-resistant diamond layer is greater than 1 mm, the current does not flow in the forward direction. Therefore, the thickness of the high-resistant diamond layer must be within the range from 10 Å to 1 mm.

If the high-resistant diamond layer has a specific resistance less than $10^2$ Ω.cm, the current leakage in the reversed direction becomes substantially high. Therefore, the specific resistance of the high-resistant diamond layer must be at least $10^2$ Ω.cm or higher.

The diamond film rectifying element is useful for high frequency applications. The diamond film rectifying element comprising a substrate; a semiconducting layer or highly-oriented diamond film grown on a substrate by chemical vapor deposition, in which at least 80% of the surface area of said diamond film consists of either (100) crystal planes or (111) crystal planes, and the differences {Δα, Δβ, Δγ} of Euler angles {α, β, γ}, which represent the orientations of the crystal planes, simultaneously satisfy |Δα|≦5°, |Δβ|≦5°, |Δγ|≦5° between adjacent crystal planes; and a pair of electrodes provided on a face of the semiconducting layer or provided on opposite faces of the semiconducting layer diamond film rectifying element further comprising a high-resistant diamond layer of 10 Å to 1 mm thickness and $10^2$ Ω.cm or more specific resistance between at least one of the electrodes and the semiconducting layer of highly-oriented diamond film is useful as high voltage and high power rectifying elements.

Since the diamond rectifying element according to the present invention is chemically stable and resistant against radiation, it can be used under severe environmental conditions.

Also, the rectifying element of the present invention can be used as a thermistor by monitoring changes in the forward or reverse current with temperature.

The material for the electrode can be either single layer or multi-layer of a material or materials selected from the group consisting of Mg, Al, Ti, Cr, Mn, Fe, Co, Ni, Zn, Nb, Mo, Pd, Ag, Sn, W, Pt, Au, Pb, as well as carbides and silicides of these substances, and a low-resistant diamond and a low-resistant silicon. Besides these materials, silicon carbide, silicon nitride and boron nitride and the like may be also used.

Moreover, by coating the highly-oriented diamond film with a passivation film, the heat resistance of the element can be improved. Diode logic circuits and the like can be fabricated by integrating diamond rectifying elements obtained by the present invention.

BRIEF DESCRIPTION OF THE DRAWINGS

FIGS. 1A and 1B are diagrams showing relationship between the surface structure of the highly-oriented diamond film and Euler angles: FIG. 1A shows the standard orientation of crystalline plane, while FIG. 1B shows the surface structure of the diamond film in which the (100) planes are highly-oriented;

DETAILED DESCRIPTION OF THE PREFERRED EMBODIMENTS

Figure 2:
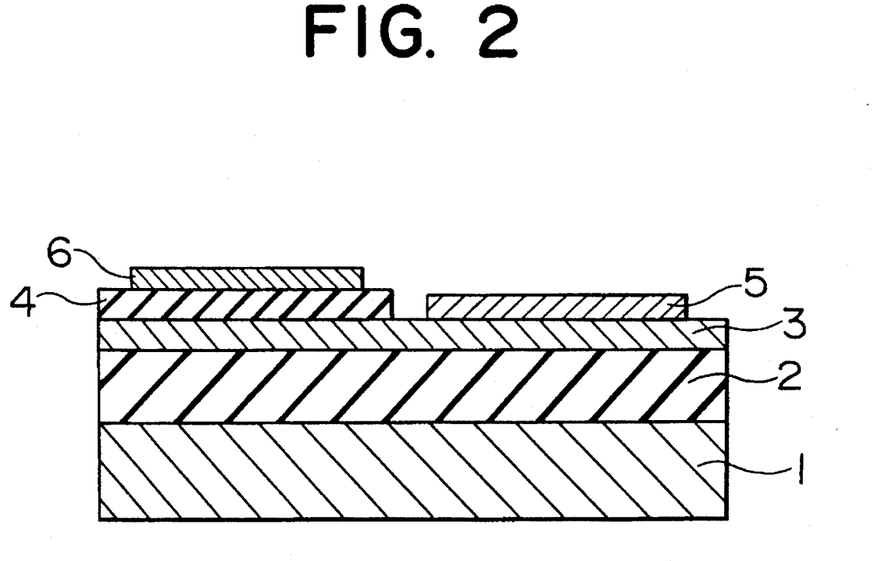
FIG. 2 is a cross sectional view showing the diamond rectifying element according to a first embodiment of the present invention.

Referring to the attached drawings, the embodiment according to the present invention will be described in detail. FIG. 2 is a cross sectional view showing the diamond rectifying element according to a first embodiment of the present invention. As shown in FIG. 2, an insulating diamond film 2 is deposited on a silicon wafer 1 as a basal layer and on the diamond film 2 is deposited a boron(B)-doped p-type semiconducting diamond film 3. By eliminating the substrate used during chemical vapor deposition, the highly-oriented diamond film is self supported. Then an undoped diamond film 4 is selectively deposited on the p-type diamond film 3. A Au electrode 6 is formed on the undoped insulating diamond film 4 and the ohmic electrode 5 consisting of a Au/Ti bi-layer is formed in the region on the p-type diamond film 3 uncovered with said undoped diamond film 4. The diamond films 2 and 4, and the p-type diamond film 3 are all formed of highly-oriented diamond films.

The characteristics of rectifying element according to the examples of the present invention, which has the above-mentioned structure, will be described in comparison with comparative examples. First, the manufacturing process of this rectifying element will be explained referring to FIG. 2.

(Step 1)

An one inch silicon wafer 1 of (100) cut (n-type, specific resistance: 1000 Ω.cm or more) was used as a substrate to deposit a highly-oriented diamond film thereon. This substrate was placed in a chamber for microwave plasma CVD and treated for 15 minutes under the following conditions: the source gas was 2.5% methane and 97.5% hydrogen, the gas pressure was 25 Torr, the gas flow rate was 300 ml/min, and the substrate temperature was 750° C. The power source of about 1100 W was used to generate microwave, but the power was slightly adjusted so as to maintain the constant substrate temperature at 750° C. At the same time, a negative bias was applied to the substrate. The negative biasing current was 12 mA/cm².

(Step 2)

Subsequently, the diamond film deposition was continued for 30 hours under the following conditions: the source gas was 0.5% methane, 99.4% hydrogen and, 0.1% oxygen, the gas pressure was 30 Torr, the gas flow rate was 300 ml/min, and the substrate temperature was 800° C. As a result, a highly-oriented diamond film 2 of about 8 μm thickness was obtained. An observation by electron microscopic indicated that 88% of the film surface was covered by (100) crystal planes. From photographs of the film cross section, the maximum deviation of the crystal plane positions was found to be 0.2 μm or less.

In addition, two electron micrographs of the film surface were taken at angles ±10° from the film surface normal and the inclinations of the (100) crystalline planes were determined. It was found that the differences of surface inclinations between adjacent crystals satisfied all conditions of $|\Delta\alpha|\leq 5°$, $|\Delta\beta|\leq 5°$, $|\Delta\gamma|\leq 5°$, and $(\Delta\alpha)^2+(\Delta\beta)^2+(\Delta\gamma)^2=35$ (Step 3)

Similar experiments were repeated by changing the growth conditions in Step 1 according to Table 1. Sample 1 in Table 1 was the same as the one already described above.

TABLE 1

| Sample No. | Concentration of methane (%) | Concentration of hydrogen (%) | Temperature of substrate (°C.) |
|---|---|---|---|
| 1 | 2.5 | 97.5 | 750 |
| 2 | 3.0 | 97.0 | 800 |
| 3 | 3.5 | 96.5 | 830 |
| 4 | 4.0 | 96.0 | 850 |

In Sample 2, 82% of the film surface was covered by crystals with (100) crystalline planes and the remaining 18% was gaps between crystal planes. The differences of the inclinations between adjacent crystal planes satisfy the conditions of $|\Delta\alpha|\leq 5°$, $|\Delta\beta|\leq 5°$ and $|\Delta\gamma|\leq 5°$. The value $(\Delta\alpha)^2+(\Delta\beta)^2+(\Delta\gamma)^2$ for Sample 2 is 70.

On the other hand, in Samples 3 and 4, 77% and 70%, respectively, of the film surface were covered by (100) crystal planes and at least one of the differences of the inclinations between adjacent crystal planes was fallen in the range of $|\Delta\alpha|\leq 5°$, $|\Delta\beta|\leq 5°$ or $|\Delta\gamma|\leq 5°$. The values $(\Delta\alpha)^2+(\Delta\beta)^2(\Delta\gamma)^2$ for Samples 3 and 4 are 85 and 105, respectively.

(Step 4)

The diamond film rectifying elements were produced using insulating diamond films 2 of Samples 1 to 4 as the substrates of the rectifying elements. The identical process was used for all samples. That is, the B-doped p-type diamond film 3 as the semiconducting layer of 5 μm thickness was grown on said insulating diamond film 2. The growth conditions were as follows: the source gas was 0.5% methane, 99.5% hydrogen and 1.0 ppm diborane, the gas pressure was 35 Torr, and the substrate temperature was 800° C.

(Step 5)

A 0.5 μm thick undoped diamond film 4 was selectively formed on the B-doped diamond film 3, using a silicon oxide film as a mask for selective deposition. The growth conditions for the undoped diamond film 4 is the same as that for growing the semiconducting diamond film 3, except that diborane was not added.

(Step 6)

After silicon oxide film used for selective deposition was removed, the samples were subjected to a heat treatment at 850° C. in vacuum for 30 minutes in order to stabilize the electrical characteristics of the undoped diamond film 4. Subsequently, the samples were cleaned with chromic acid, aqua regia and RCA.

(Step 7)

Finally, the ohmic electrode 5 consisting of an Au/Ti bilayer structure was formed by a sputtering method on the B-doped p-type semiconducting diamond film 3, while the Au electrode 6 of 200 μm in diameter was formed by the electron beam deposition method on the undoped diamond film 4. Thus, twenty diamond film rectifying elements were prepared simultaneously on the silicon wafer.

Figure 3:
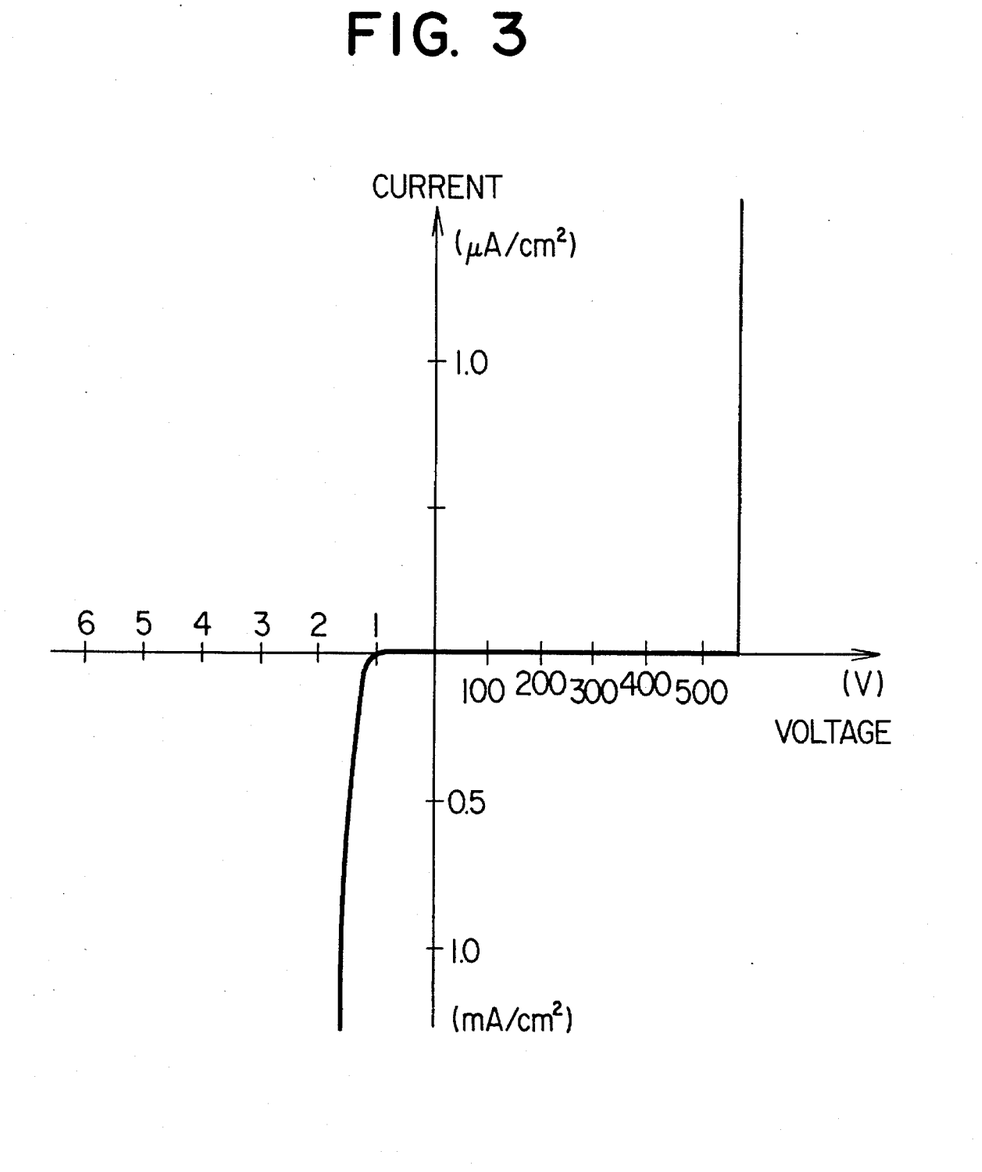
FIG. 3 is a graph showing the rectifying characteristics of the rectifying element according to the first embodiment of the present invention.

FIG. 3 shows the electrical characteristics of the rectifying element prepared according the conditions of Sample 1. As seen in FIG. 3, the rectifying characteristics is excellent, and the breakdown voltage in the reverse direction was 550 V, and the current density in the forward direction was 300 A/cm$^2$ at 5 V. Such excellent rectifying characteristics were also observed even at 600° C.

Figure 4:
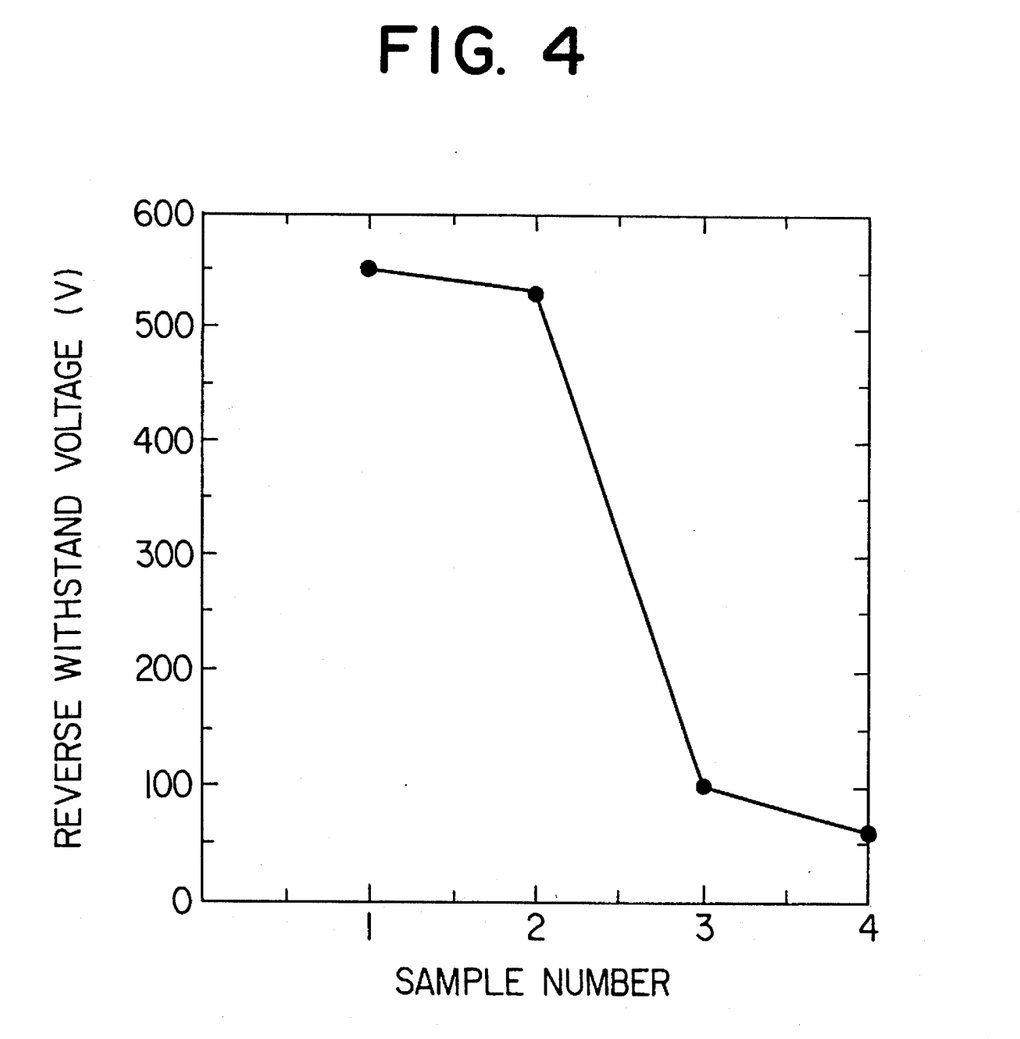
FIG. 4 is a graph showing the reverse-direction breakdown voltage of the diamond rectifying element prepared under different growth conditions.

FIG. 4 shows the reverse-direction breakdown voltage of the diamond rectifying element prepared under each of the conditions listed in Table 1. As shown in FIG. 4, Samples 1 and 2 according to the embodiment of the present invention show excellent rectifying characteristics, while the characteristics of Samples 3 and 4 are not so good. Thus, it is concluded that the achieve excellent rectifying characteristics, the diamond film must be highly-oriented as defined in the present invention.

Figure 5:
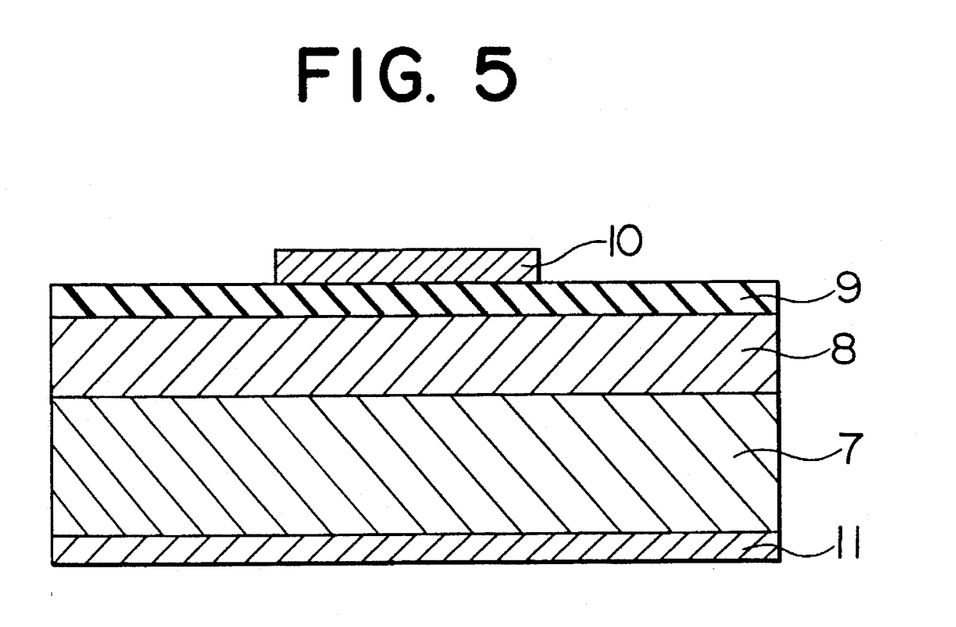
FIG. 5 is a cross sectional view showing the diamond rectifying element according to a second embodiment of the present invention.

Next, a second embodiment according to the present invention will be described in detail, referring to FIG. 5. As shown in FIG. 5, a B-doped p-type diamond film 8 is deposited on a silicon wafer 7, and on the diamond film 8 is deposited undoped diamond film 9. An Au electrode 10 is selectively formed on the undoped diamond film 9, while an ohmic electrode 11 is formed on the back surface of the silicon wafer 7, further applying heat-resistant Ag paste thereon. In the present embodiment, the p-type diamond film 8 and the undoped diamond film 9 are the highly-oriented diamond films.

The characteristics of the rectifying element according to the examples of the present invention, which has the above-mentioned structure, will be described in comparison with comparative examples. First, the manufacturing process of this rectifying element will be explained, referring to FIG. 5.

(Step 1)

An one inch silicon wafer 1 of (100) cut (specific resistance: 0.1 Ω.cm or less) was used as a substrate to deposit a highly-oriented diamond film thereon. This substrate was placed in a chamber for microwave plasma CVD and treated for 15 minutes under the following conditions: the source gas was 2.5% methane, 97.5% hydrogen and 1.0 ppm diborane, the gas pressure was 25 Torr, the gas flow rate was 300 ml/min, and the substrate temperature was 750° C. The power source of about 1100 W was used to generate microwave, but the power was slightly adjusted so as to maintain the constant substrate temperature at 750° C. At the same time, a negative bias was applied to the substrate. The negative biasing current was 12 mA/cm$^2$.

(Step 2)

Subsequently, the diamond film deposition was continued for 10 hours under the following conditions: the source gas was 0.5% methane, 99.5% hydrogen and 0.1 ppm of diborane, the gas pressure was 30 Torr, gas flow was 300 ml/min, and the substrate temperature was 800° C. As a result, the highly-oriented B-doped p-type diamond film 8 of about 3 μm thickness was obtained. An observation by electron microscope indicated that 86% of the film surface was covered by the (100) crystal planes. From photographs of the film cross section, the maximum deviation of the crystal plane position was found to be 0.2 μm or less.

In addition, two electron micrographs of the film surface were taken at angles of +10° and −10° from the film surface normal and the inclinations of the (100) crystal planes were determined.

It was found that the differences of surface inclinations between adjacent crystals satisfied all conditions of $|\Delta\alpha|\leq 5°$, $|\Delta\beta|\leq 5°$ and $|\Delta\gamma|\leq 5°$, and $(\Delta\alpha)^2+(\Delta\beta)^2+(\Delta\gamma)^2=33$.

(Step 3)

The undoped diamond film 9 of 0.5 μm thickness was grown on the p-type diamond film 8. The growth conditions were as follows: the source gas was 0.5% methane, 99.4% hydrogen and 0.1% oxygen, the gas pressure was 30 Torr, and the substrate temperature was 800° C.

(Step 4)

The samples were subjected to the heat treatment at 850° C. in vacuum for 30 minutes in order to stabilize the electrical characteristics of the undoped diamond film 9. Subsequently, the samples were cleaned with chromic acid, aqua regia and RCA.

(Step 5)

Finally, an Au electrode 10 of 200 μm in diameter was formed by an electron beam deposition method on the undoped diamond film 9, and an ohmic electrode 11 was formed on the back surface of the low-resistant silicon substrate 7 using heat-resistant Ag paste.

Figure 6:
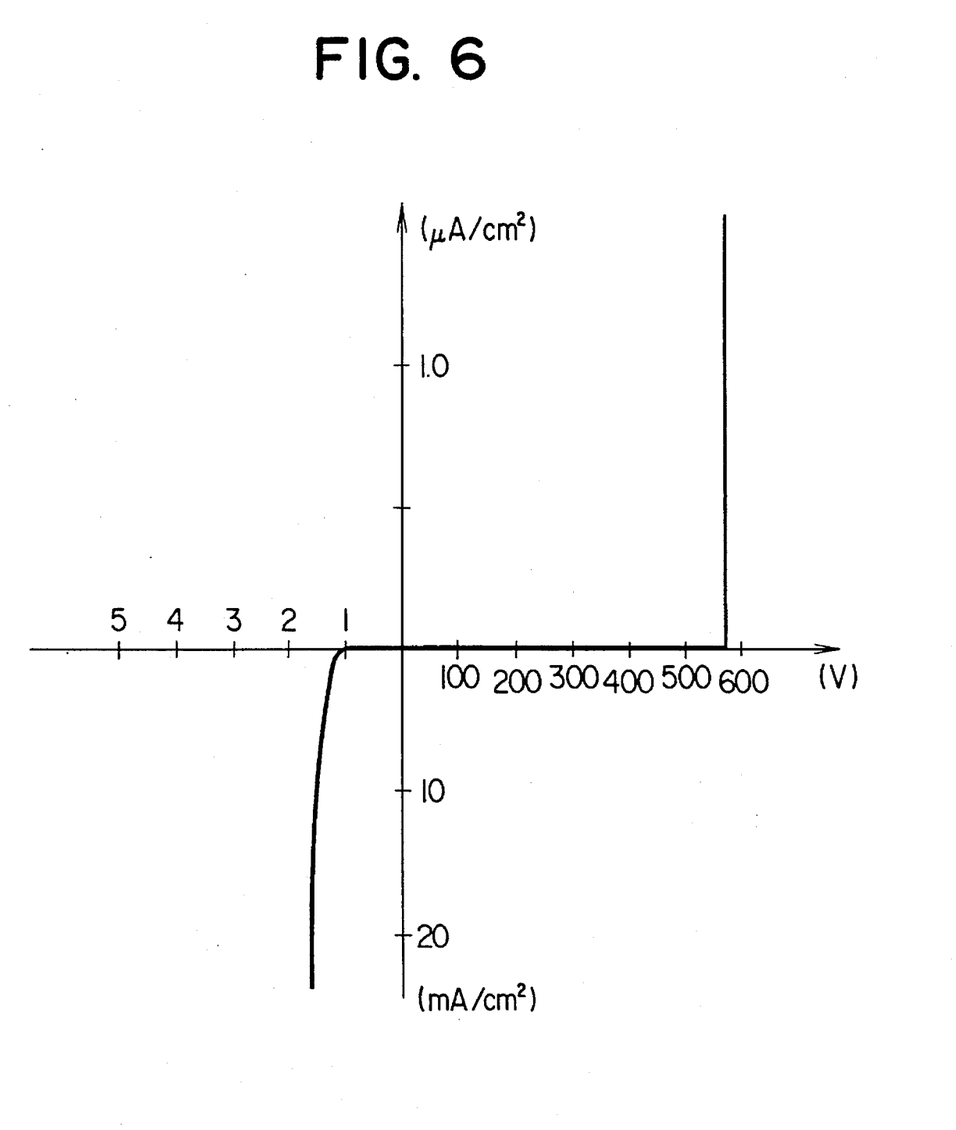
FIG. 6 is a graph showing the rectifying characteristics of the rectifying element according to the second embodiment of the present invention.

FIG. 6 shows the electrical characteristics of the diamond film rectifying elements obtained. As seen in FIG. 6, the excellent rectifying characteristics are obtained when the highly-oriented semiconducting diamond film 8 is deposited directly on the conducting substrate without using the basal insulating diamond film 2 as a substrate (see FIG. 2).

The present invention is not necessarily limited to the above examples. The highly-oriented diamond film can be used only at least for a semiconducting layer.

In the present invention, a highly-oriented diamond film is used as a the basal insulating diamond layer, the semiconducting diamond layer and the undoped diamond layer between the electrode and said semiconducting layer. The present invention provides a diamond film rectifying element, which has an excellent electrical characteristics, and the manufacturing process thereof, which is suitable for mass production of said diamond film rectifying elements at low cost. The diamond film rectifying element according to the present invention may be useful as heat-resistant, high power and high-frequency rectifying elements.

What is claimed is;

1. A diamond rectifying element, comprising a semiconducting layer of highly-oriented diamond film, in which at least 80% of the surface area of said diamond film consists of (100) crystal planes, and the differences $\{\Delta\alpha, \Delta\beta, \Delta\gamma\}$ of Euler angles $\{\alpha, \beta, \gamma\}$, which represent the orientations of the crystal planes, and simultaneously satisfy $|\Delta\alpha|\leq 5°$, $|\Delta\beta|\leq 5°$, $|\Delta\gamma|\leq 5°$ between adjacent (100) crystal planes; and a pair of electrodes provided on a first face of said semiconductor layer.

2. A diamond rectifying element, comprising a semiconducting layer of highly-oriented diamond film in which at least 80% of the surface area of said diamond film consists of (111) crystal planes, and the differences $\{\Delta\alpha, \Delta\beta, \Delta\gamma\}$ of Euler angles $\{\alpha, \beta, \gamma\}$, which represent the orientations of the crystal planes, simultaneously satisfy $|\Delta\alpha|\leq 5°$, $|\Delta\beta|\leq 5°$, $|\Delta\gamma|\leq 5°$ between adjacent (111) crystal planes; and a pair of electrodes provided on a first face of said semiconducting layer.

3. A diamond rectifying element according to claim 1 further comprising a high-resistant diamond layer of 10 Å to 1 mm thickness and $10^2$ Ω.cm or more of specific resistance between at least one of said electrodes and said semiconducting layer of highly-oriented diamond film.

4. A diamond rectifying element according to claim 2 further comprising a high-resistant diamond layer of 10 Å to 1 mm thickness and $10^2$ Ω.cm or more of specific resistance between at least one of said electrodes and said semiconducting layer of highly-oriented diamond film.

5. A diamond rectifying element according to claim 1 further comprising an insulating diamond basal layer consisting of a highly-oriented diamond film on a second face of said semiconducting layer opposite said first face.

6. A diamond rectifying element according to claim 2 further comprising an insulating diamond basal layer consisting of a highly-oriented diamond film on a second face of said semiconducting layer opposite said first face.

7. A diamond rectifying element according to claim 1 further comprising a nondiamond substrate on a second face of said semiconducting layer opposite said first face.

8. A diamond rectifying element according to claim 2 further comprising a nondiamond substrate on a second face of said semiconducting layer opposite said first face.

9. A diamond rectifying element according to claim 1 wherein each of said electrodes is a layer or multi-layer formed of a material or materials selected from the group consisting of Mg, Al, Ti, Cr, Mn, Fe, Co, Ni, Zn, Nb, Mo, Pd, Ag, Sn, W, Pt, Au, Pb, the carbides and silicides of these substances, low-resistant diamond, silicon, silicon carbide, silicon nitride and boron nitride.

10. A diamond rectifying element according to claim 2 wherein each of said electrodes is a layer or multi-layer formed of a material or materials selected from the group consisting of Mg, Al, Ti, Cr, Mn, Fe, Co, Ni, Zn, Nb, Mo, Pd, Ag, Sn, W, Pt, Au, Pb, the carbides and silicides of these substances, low-resistant diamond silicon, silicon carbide, silicon nitride and boron nitride.

11. A diamond rectifying element according to claim 1 wherein said highly-oriented diamond film is a p-type diamond film.

12. A diamond rectifying element according to claim 2 wherein said highly-oriented diamond film is a p-type diamond film.

13. A diamond rectifying element according to claim 11 wherein said p-type diamond film is a boron-doped diamond film.

14. A diamond rectifying element according to claim 12 wherein said p-type diamond film is a boron-doped diamond film.

15. A diamond rectifying element, comprising a semiconducting layer of highly-oriented diamond film, in which at least 80% of the surface area of said diamond film consists of (100) crystal planes, and the differences $\{\Delta\alpha, \Delta\beta, \Delta\gamma\}$ of Euler angles $\{\alpha, \beta, \gamma\}$, which represent the orientations of the crystal planes, simultaneously satisfy $|\Delta\alpha| \leq 5°$, $|\Delta\beta| \leq 5°$, $|\Delta\gamma| \leq 5°$ between adjacent (100) crystal planes;

a first electrode provided on a first face of said semiconducting layer; and a second electrode provided on a second face of said semiconducting layer opposite said first face.

16. A diamond rectifying element according to claim 15 further comprising a high-resistant diamond layer of 10 Å to 1 mm thickness and $10^2$ $\Omega$.cm or more of specific resistance between said first electrode and said first face of said semiconducting layer of highly-oriented diamond film.

17. A diamond rectifying element according to claim 15 further comprising a nondiamond substrate between said second face of said semiconducting layer and said second electrode.

18. A diamond rectifying element according to claim 15 wherein each of said electrodes is a layer or multi-layer formed of a material or materials selected from the group consisting of Mg, Al, Ti, Cr, Mn, Fe, Co, Ni, Zn, Nb, Mo, Pd, Ag, Sn, W, Pt, Au, Pb, the carbides and silicides of these substances, low-resistant diamond, silicon, silicon carbide, silicon nitride and boron nitride.

19. A diamond rectifying element according to claim 15 wherein said highly-oriented diamond film is a p-type diamond film.

20. A diamond rectifying element according to claim 19 wherein said p-type diamond film is a boron-doped diamond film.

21. A diamond rectifying element, comprising a semiconducting layer of highly-oriented diamond film, in which at least 80% of the surface area of said diamond film consists of (111) crystal planes, and the differences $\{\Delta\alpha, \Delta\beta, \Delta\gamma\}$ of Euler angles $\{\alpha, \beta, \gamma\}$, which represent the orientations of the crystal planes, simultaneously satisfy $|\Delta\alpha| \leq 5°$, $|\Delta\beta| \leq 5°$, $|\Delta\gamma| \leq 5°$ between adjacent (111) crystal planes;

a first electrode provided on a first face of said semiconducting layer; and a second electrode provided on a second face of said semiconducting layer opposite said first face.

22. A diamond rectifying element according to claim 21 further comprising a high-resistant diamond layer of 10 Å to 1 mm thickness and $10^2$ $\Omega$.cm or more of specific resistance between said first electrode and said first face of said semiconducting layer of highly-oriented diamond film.

23. A diamond rectifying element according to claim 21 further comprising a nondiamond substrate between said second face of said semiconducting layer and said second electrode.

24. A diamond rectifying element according to claim 21 wherein each of said electrodes is a layer or multi-layer formed of a material or materials selected from the group consisting of Mg, Al, Ti, Cr, Mn, Fe, Co, Ni, Zn, Nb, Mo, Pd, Ag, Sn, W, Pt, Au, Pb, the carbides and silicides of these substances, low-resistant diamond, silicon, silicon carbide, silicon nitride and boron nitride.

25. A diamond rectifying element according to claim 21 wherein said highly-oriented diamond film is a p-type diamond film.

26. A diamond rectifying element according to claim 25 wherein said p-type diamond film is a boron-doped diamond film.

* * * * *